US006944088B2

United States Patent
Asano et al.

(10) Patent No.: US 6,944,088 B2
(45) Date of Patent: Sep. 13, 2005

(54) APPARATUS AND METHOD FOR GENERATING MEMORY ACCESS SIGNALS, AND MEMORY ACCESSED USING SAID SIGNALS

(75) Inventors: Toru Asano, Omihachiman (JP); Sang Hoo Dhong, Austin, TX (US); Joel Abraham Silberman, Somers, NY (US); Osamu Takahashi, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 540 days.

(21) Appl. No.: 10/262,500

(22) Filed: Sep. 30, 2002

(65) Prior Publication Data

US 2004/0064674 A1 Apr. 1, 2004

(51) Int. Cl.[7] .................................................. G11C 8/00
(52) U.S. Cl. ............................. 365/230.06; 365/230.01
(58) Field of Search ....................... 365/230.06, 230.08, 365/230.01; 341/50–60; 711/118–119, 219–220; 712/210–213

(56) References Cited

U.S. PATENT DOCUMENTS

| | | | | |
|---|---|---|---|---|
| 5,465,224 A | * | 11/1995 | Guttag et al. ............... | 708/236 |
| 5,710,731 A | | 1/1998 | Ciraula et al. | |
| 5,754,819 A | | 5/1998 | Lynch et al. | |
| 5,860,092 A | * | 1/1999 | Breid et al. .................. | 711/118 |
| 6,016,543 A | * | 1/2000 | Suzuki et al. ............... | 712/233 |
| 6,088,763 A | | 7/2000 | Silberman et al. | |

* cited by examiner

Primary Examiner—Gene N. Auduong
(74) Attorney, Agent, or Firm—Carr LLP; Diana R. Gerhardt

(57) ABSTRACT

A sum decoder is disclosed including multiple sum predecoders, a carry generator, and multiple rotate logic units. Each sum predecoder receives multiple bit pairs of non-overlapping segments of a first and second address signal, and produces an input signal dependent upon the bit pairs. The carry generator receives a lower-ordered portion of the first and second address signals, and generates multiple carry signals each corresponding to a different one of the sum predecoders. Each rotate logic unit receives the input signal produced by a corresponding sum predecoders and a corresponding one of the carry signals, rotates the bits of the input signal dependent upon the carry signal, and produces either the input signal or the rotated input signal as an output signal. A memory is described including the sum decoder, a final decode block, and a data array. The final decode block performs logical operations on the output signals of the sum decoder to produce selection signals. Each of the selection signals activates a word line of the data array. A method is disclosed for producing signals for accessing a memory. Highest ordered portions of the first and second address signals are divided into multiple non-overlapping segments. An input signal (i.e., an I term) is generated for each of the segments, as is a carry signal. For each of the segments, when the corresponding carry signal is set, the corresponding I term is rotated one bit position. The I terms are produced as the signals.

21 Claims, 9 Drawing Sheets

APPARATUS AND METHOD FOR GENERATING MEMORY ACCESS SIGNALS, AND MEMORY ACCESSED USING SAID SIGNALS

TECHNICAL FIELD

This invention relates generally to memory systems and, more particularly, to semiconductor memory systems accessed dependent upon a sum of two input numbers (e.g., addresses).

BACKGROUND OF THE INVENTION

Modern processors often address memory systems using effective addresses formed by adding an offset to a base address (i.e., using base plus offset addressing). For example, base plus offset addressing is typically used in load instructions and relative branch instructions. In general, adding two numbers (e.g., addresses) expressed as binary digits (bits) involves adding bits in corresponding ordered bit positions. A carry signal is generated for each added pair of bits, and the carry signals are provided as inputs to higher ordered bit pair additions. This carry signal propagation is relatively slow, and ultimately determines the total amount of time required to add the two numbers.

In general, sum-addressed memories (SAMs) store data accessed dependent upon a sum of two input numbers (e.g., addresses). Many SAMs do not actually add the two input numbers, thus avoiding carry propagation and the associated latency. Instead, these SAMs detect when the sum of the two input numbers is equal to another number; that is, when (A+B=K), where the two input numbers are A and B. In general, an (A+B=K) equality test can be performed in less time than it would otherwise take to add the two numbers A and B.

A typical SAM cache memory includes a sum decoder used to generate signals to select a particular word line within one or more data arrays. FIG. 1 is a diagram of a conventional sum decoder 100 used to generate signals to select a particular word line within one of two data arrays (e.g., an even data array and an odd data array) of a sum-addressed memory (SAM) cache dependent upon an arithmetic sum of a 14-bit base address A[13:0] and a 14-bit offset address B[13:0]. The conventional sum decoder 100 uses the above described (A+B=K) equality test to eliminate the time-consuming carry propagation typical of conventional addition circuits.

The conventional sum decoder 100 includes four 2-bit sum predecoders 102A–102D, a low order carry generator 104, and even/odd select logic 106. Each of the 2-bit sum predecoders 102 actually receives 3 base address bits and 3 offset address bits, and produces 8 predecoded signals for final decode. The sum decoder 100 of FIG. 1 produces 4 groups of 8-bit predecoded signals. The 4 groups of 8-bit predecoded signals may be, for example, provided to a final decode block. Logic (e.g., NAND logic) within the final decode block may use the 4 groups of 8-bit predecoded signals to produce signals that select (i.e., activate) one of 512 word lines of both the even data array and the odd data.

The low order carry generator 104 receives the 5 lowest-ordered base and offset address bits, and uses the 5 lowest-ordered base and offset address bits to generate a carry signal. The even/odd select logic 106 receives base address bit A[5], offset address bit B[5], and the carry signal, and uses the base address bit A[5], offset address bit B[5], and the carry signal to generate an even/odd select signal. The even/odd select signal may be used to select between the data outputs produced by the even data array and the odd data array.

A problem arises in that the circuitry of the conventional sum decoder 100 is relatively complex and typically includes multiple sequential stages (i.e., cascaded levels) of exclusive-OR (XOR) logic functions. Typical implementations of XOR logic functions tend to be relatively slow compared to other types of logic functions (e.g., AND, OR, NAND, NOR, and the like). To increase circuit speed, XOR logic functions may be implemented using dynamic logic, or relatively complex static logic (i.e., combinations of faster and simpler logic gates). In general, however, such increases in circuit speed are usually achieved at the cost of increased electrical power dissipation.

SUMMARY OF THE INVENTION

A sum decoder is disclosed, including multiple sum predecoders, a carry generator, and multiple rotate logic units. Each of the sum predecoders receives multiple pairs of bits (i.e., bit pairs) of non-overlapping segments of a first address signal and a second address signal, and produces an input signal dependent upon the bit pairs. The carry generator receives a lower-ordered portion of the first and second address signals, and generates multiple carry signals each corresponding to a different one of the sum predecoders. Each of the rotate logic units receives the input signal produced by a corresponding one of the sum predecoders and a corresponding one of the carry signals, rotates the bits of the input signal dependent upon the carry signal, and produces either the input signal or the rotated input signal as an output signal. The output signals produced by the rotate logic units may be, for example, used to access a data array of a memory.

A memory is described including the sum decoder, a final decode block, and a data array. The final decode block receives the output signals produced by the rotate logic units of the sum decoder, and performs logical operations on the output signals to produce multiple selection signals. The data array stores data and includes multiple word lines, wherein each of the word lines is activated by a different one of the selection signals.

A method is disclosed for producing multiple signals for accessing a memory (e.g., a data array of a memory). The first and second address signals each include multiple bits in ordered bit positions, and each bit of the first address signal corresponds to a different bit of the second address signal. A highest ordered portion of the first address signal, and a corresponding highest ordered portion of the second address signal, are divided into multiple non-overlapping segments. An input signal (i.e., an "I" term) is generated for each of the segments, as is a carry signal. For each of the segments, in the event the corresponding carry signal is set, the corresponding I term is rotated one bit position (e.g., in a higher-ordered direction). The I terms are produced as the signals.

BRIEF DESCRIPTION OF THE DRAWINGS

The invention may be understood by reference to the following description taken in conjunction with the accompanying drawings, in which like reference numerals identify similar elements, and in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electromagnetic signaling techniques, and the like, have been omitted inasmuch as such details are not considered necessary to obtain a complete understanding of the present invention, and are considered to be within the understanding of persons of ordinary skill in the relevant art.

It is further noted that, unless indicated otherwise, all functions described herein may be performed in either hardware or software, or some combination thereof. In a preferred embodiment, however, the functions are performed by a processor, such as a computer or an electronic data processor, in accordance with code, such as computer program code, software, and/or integrated circuits that are coded to perform such functions, unless indicated otherwise.

Figure 2:
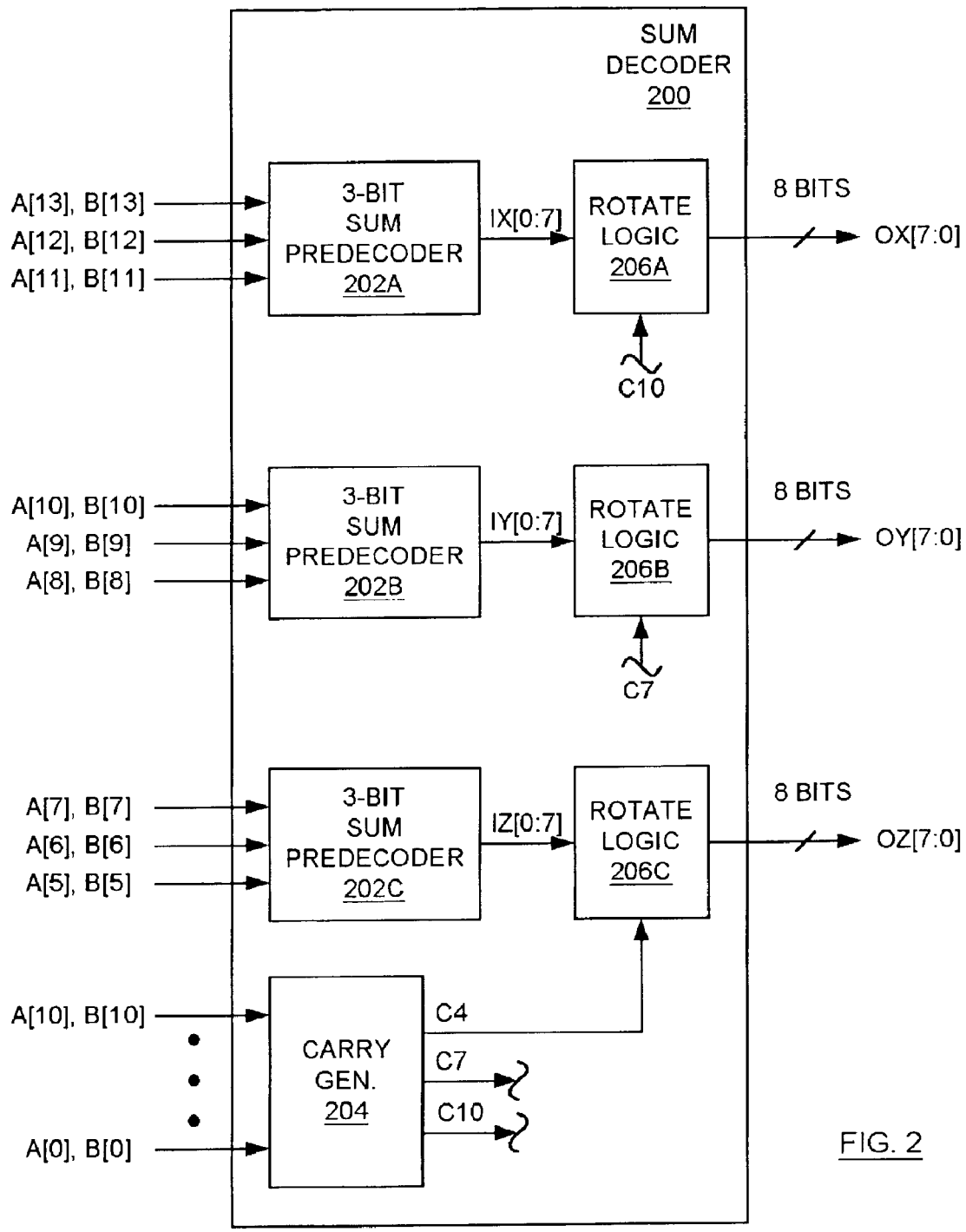
FIG. 2 is a diagram of one embodiment of a sum decoder including three 3-bit sum predecoders, a carry generator, and three instances of rotate logic.

FIG. 2 is a diagram of one embodiment of a sum decoder 200. The sum decoder 200 of FIG. 2 receives a 14-bit base address signal A[13:0] and a 14-bit offset address signal B[13:0], and produces a 24-bit output signal including three 8-bit output signals OX[7:0], OY[7:0], and OZ[7:0]. In general, the 24-bit output signal depends on an arithmetic sum of the base address signal A[13:0] and the 14-bit offset address signal B[13:0]. The 3 groups of 8-bit predecoded outputs produced by the sum decoder 200 may, for example, be decoded (e.g., by AND logic in a final decode block) to select (i.e., activate) one of (8)(8)(8)=512 word lines of a sum-addressed memory (SAM) cache. In addition, the 3 groups of 8-bit predecoded outputs may be used to generate a signal used to select between one or more data arrays of the SAM cache (e.g., between data outputs of the one or more data arrays).

In the embodiment of FIG. 2, the sum decoder 200 includes three 3-bit sum predecoders 202A–202C, a carry generator 204, and three instances of rotate logic 206A–206C. Each of the 3-bit sum predecoders 202 receives 3 base address bits and 3 offset address bits, and produces 8 output signals (i.e., an 8-bit output signal). The 3-bit sum predecoder 202A receives base address bits A[13:11] and offset address bits B[13:11], and produces an 8-bit output signal "IX[7:0]." The 3-bit sum predecoder 202B receives base address bits A[10:8] and offset address bits B[10:8], and produces an 8-bit output signal "IY[7:0]." The 3-bit sum predecoder 202C receives base address bits A[7:5] and offset address bits B[7:5], and produces an 8-bit output signal "IZ[7:0]."

Figure 1:
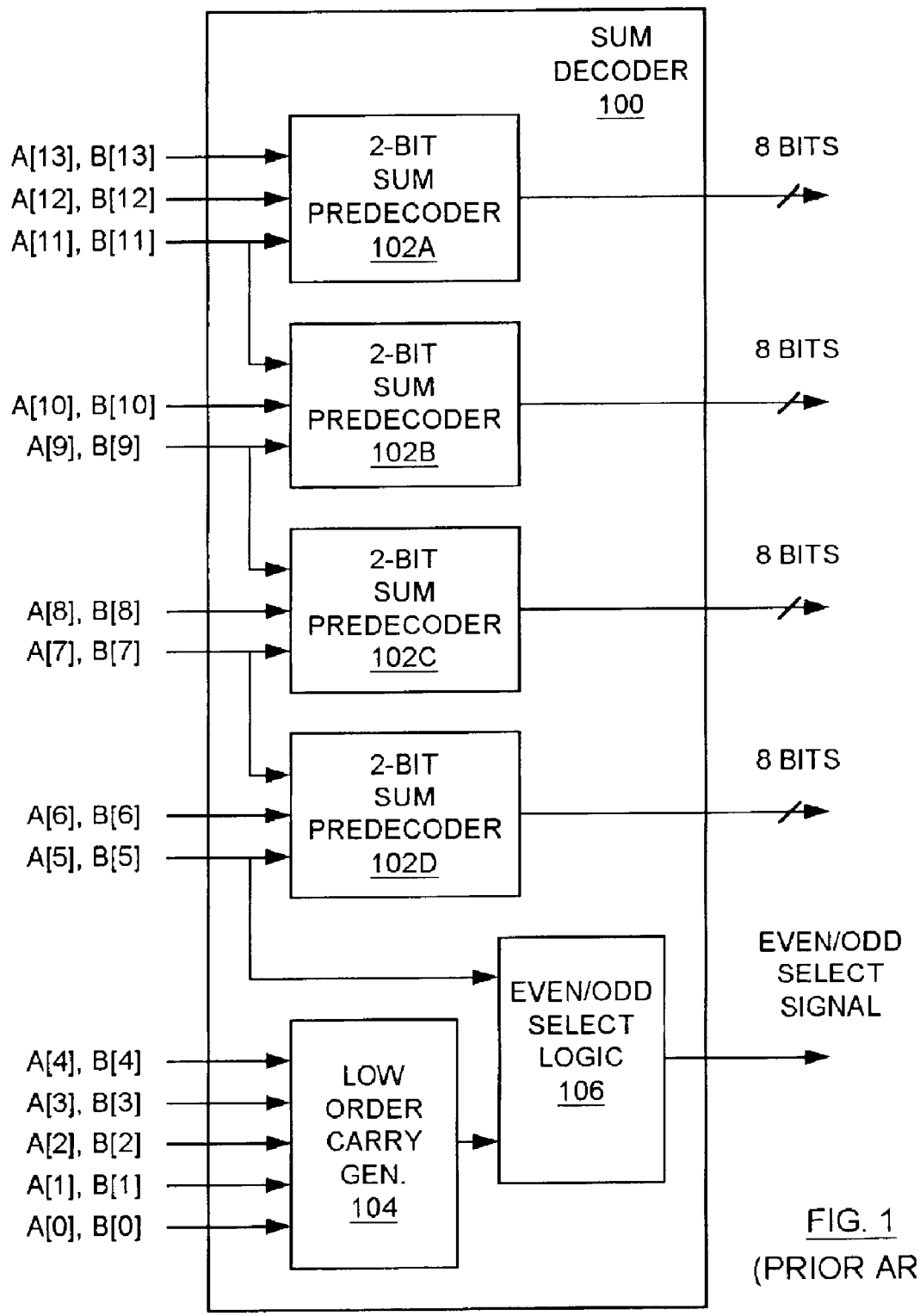
FIG. 1 is a diagram of a conventional sum decoder used to generate signals to select a particular word line within one of two data arrays of a sum-addressed memory (SAM) cache.

It is noted that, unlike the 2-bit sum predecoders 102 of FIG. 1, each of the 3-bit sum predecoders 202 receives different base address bits and offset address bits. In other words, unlike the 2-bit sum predecoders 102 of FIG. 1, the groups of base address bits and offset address bits received by the 3-bit sum predecoders 202 do not overlap. It is also noted that other embodiments of the sum decoder 200 of FIG. 2 may include, for example, 4-bit sum predecoders producing 16-bit output signals.

The carry generator 204 receives offset address bits A[10:0] and base offset address bits B[10:0]. The carry generator 204 uses offset address bits A[10:8] and base offset address bits B[10:8] to produce a carry signal C10, offset address bits A[7:5] and base offset address bits B[7:5] to produce a carry signal C7, and offset address bits A[4:0] and base offset address bits B[4:0] to produce a carry signal C4.

Each of the three instances of the rotate logic 206 receives the 8-bit output signal produced by a corresponding one of the 3-bit sum predecoders 202 and a carry signal from the carry generator 204, and produces 8 output signals (i.e., an 8-bit output signal). The rotate logic 206A receives the IX[7:0] output signal produced by the corresponding 3-bit sum predecoder 202A and the carry signal C10 produced by the carry generator 204. When the carry signal C10 is not set (i.e., deasserted or not active), the rotate logic 206A produces the IX[7:0] signal as an 8-bit output signal OX[7:0]. On the other hand, when the carry signal C10 is set (i.e., asserted or active), the rotate logic 206A rotates the IX[7:0] signal one bit position to the left (i.e., in a higher-ordered direction), and produces the rotated IX[7:0] signal as the output signal OX[7:0] such that:

OX[0]=IX[7]
OX[1]=IX[0]
OX[2]=IX[1]
OX[3]=IX[2]
OX[4]=IX[3]
OX[5]=IX[4]
OX[6]=IX[5]
OX[7]=IX[6]

The rotate logic 206B receives the IY[7:0] output signal produced by the corresponding 3-bit sum predecoder 202B and the carry signal C7 produced by the carry generator 204. When the carry signal C7 is deasserted, the rotate logic 206B produces the IY[7:0] signal as an 8-bit output signal OY[7:0]. On the other hand, when the carry signal C7 is asserted, the rotate logic 206B rotates the IY[7:0] signal one bit position to the left (i.e., in a higher-ordered direction), and produces the rotated IY[7:0] signal as the output signal OY[7:01] (i.e., in the same way the rotate logic 206A produces the output signal OX[7:0] when the carry signal C10 is asserted).

The rotate logic 206C receives the IZ[7:0] output signal produced by the corresponding 3-bit sum predecoder 202C and the carry signal C4 produced by the carry generator 204. When the carry signal C4 is deasserted, the rotate logic 206C produces the IZ[7:0] signal as an 8-bit output signal OZ[7:0]. When the carry signal C4 is asserted, the rotate logic 206C rotates the IZ[7:0] signal one bit position to the left (i.e., in a higher-ordered direction), and produces the rotated IZ[7:0] signal as the output signal OZ[7:0] (i.e., in the same way the rotate logic 206A produces the output signal OX[7:0] when the carry signal C10 is asserted).

Figure 3:
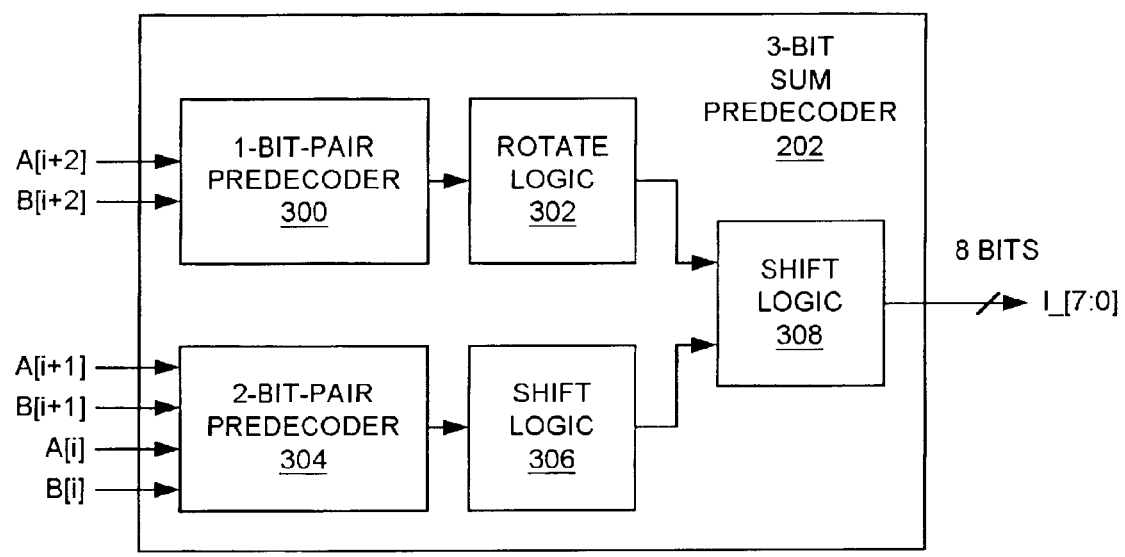
FIG. 3 is a diagram of an exemplary one of the 3-bit sum predecoders of FIG. 2, wherein the exemplary 3-bit sum predecoder includes a 1-bit-pair predecoder, a rotate logic unit, a 2-bit-pair predecoder, a first shift logic unit, and a second shift logic unit.

FIG. 3 is a diagram of an exemplary one of the 3-bit sum predecoders 202 of FIG. 2. In the embodiment of FIG. 3, the exemplary 3-bit sum predecoder 202 includes a 1-bit-pair predecoder 300, rotate logic 302, a 2-bit-pair predecoder 304, shift logic 306, and shift logic 308.

As will be described in detail below, the 1-bit-pair predecoder 300 predecodes a higher-ordered bit pair of the base and offset address signals received by the 3-bit sum predecoder 202. The rotate logic 302 sums the higher-ordered bit pair via rotation to form a 2-bit "R" term "R[1:0]." The 2-bit-pair predecoder 304 decodes the 2 remaining lower-ordered bit pairs of the base and offset address signals received by the 3-bit sum predecoder 202. The shift logic 306 sums the two lower-ordered bit pairs via shifting to form a 7-bit "L" term "L[6:0]." The shift logic 308 sums the 2-bit R term R[1:0] and the 7-bit L term L[6:0] to produce an 8-bit output "I" term "I_[7:0]" of the 3-bit sum predecoder 202 by shifting the L term by the value of the R term.

Figure 4:
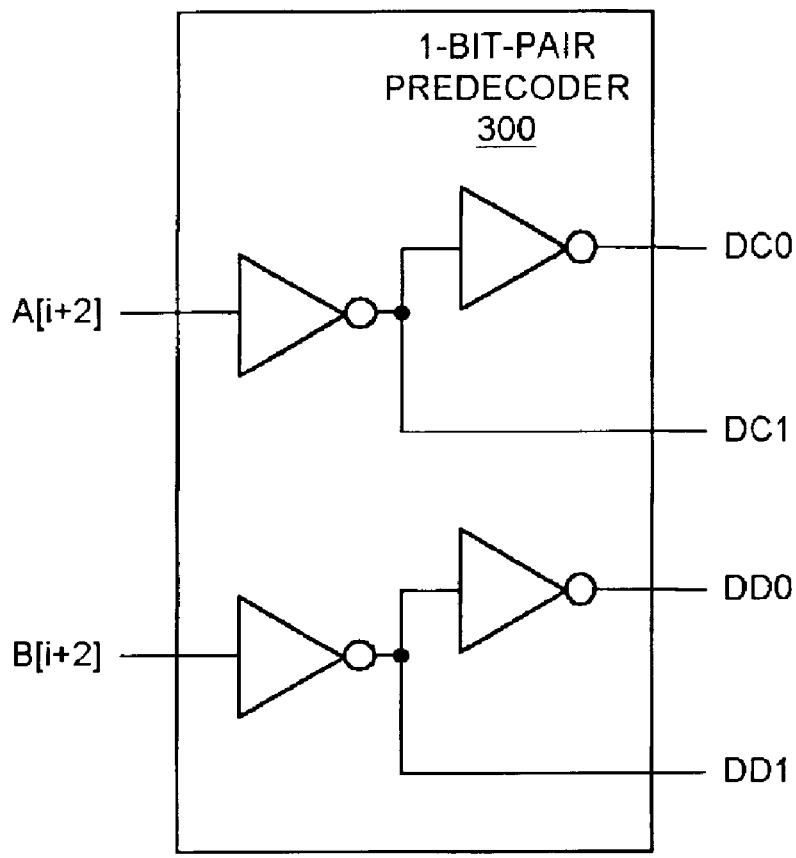
FIG. 4 is a diagram of one embodiment of the 1-bit-pair predecoder of FIG. 3.

FIG. 4 is a diagram of one embodiment of the 1-bit-pair predecoder 300 of FIG. 3. In the embodiment of FIG. 4, the 1-bit-pair predecoder 300 receives a base address signal A[i+2] and an offset address signal B[i+2], and predecodes the A[i+2] and B[i+2] signals, thereby producing output signals "DC0," "DC1," "DD0," and "DD1" such that:

DC0=A[i+2]
DC1=A[i+2]'
DD0=B[i+2]
DD1=B[i+2]'

Figure 5:
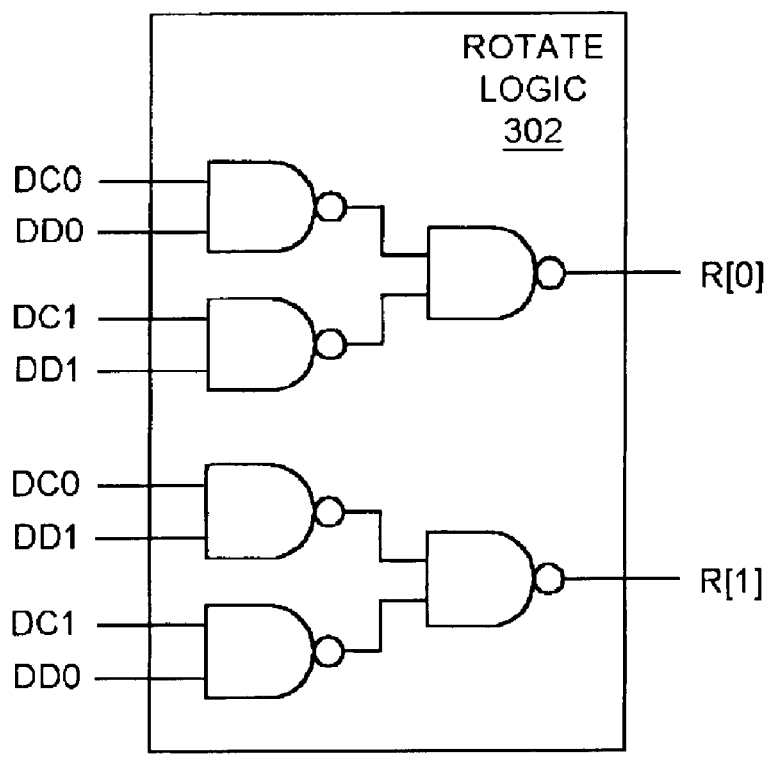
FIG. 5 is a diagram of one embodiment of the rotate logic unit of FIG. 3.

FIG. 5 is a diagram of one embodiment of the rotate logic 302 of FIG. 3. In the embodiment of FIG. 5, the rotate logic 302 receives the DC0, DC1, DD0, and DD1 signals produced by the 1-bit-pair predecoder 300 of FIGS. 3–4, and uses the DC0, DC1, DD0, and DD1 signals to sum the bit pair A[i+2] and B[i+2] via rotation, thereby producing a 2-bit R term R[1:0] such that:

R[0]=A[i+2]'⊕B[i+2]=A[i+2]⊕B[i+2]'
R[1]=A[i+2]⊕B[i+2]=A[i+2]'⊕B[i+2]'

It is noted that while conventional sum decoders typically use multiple sequential stages (i.e., cascaded levels) of XOR logic, the rotate logic 302 of FIGS. 3 and 5 uses only a single stage of XOR logic functions in to produce the R[0] and R[1] signals. In the embodiment of FIG. 2, the sum decoder 200 does not include multiple cascaded levels of XOR logic. As typical implementations of XOR logic functions tend to be relatively slow and/or dissipate more electrical power, the sum decoder 200 of FIG. 2 expectedly operates faster and/or dissipates less electrical power than conventional sum decoders.

Figure 6:
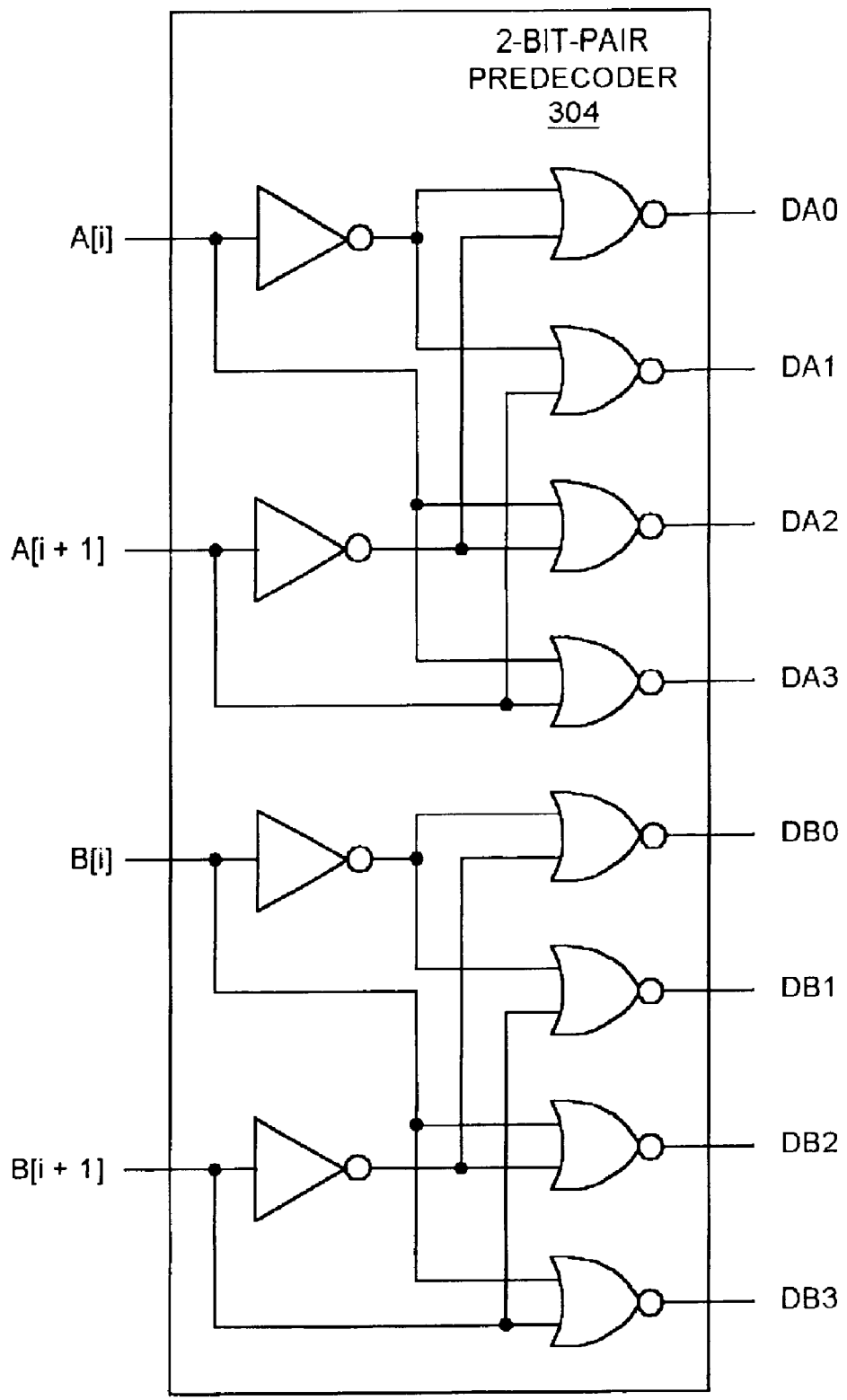
FIG. 6 is a diagram of one embodiment of the 2-bit-pair predecoder of FIG. 3.

FIG. 6 is a diagram of one embodiment of the 2-bit-pair predecoder 304 of FIG. 3. In the embodiment of FIG. 6, the 2-bit-pair predecoder 304 receives base address signals A[i+1] and A[i] and offset address signal B[i+1] and B[i], and predecodes the A[i+1], A[i], B[i+1], and B[i] signals, thereby producing signals "DA0," "DA1," "DA2," "DA3," "DB0," "DB1," "DB2," and "DB3" such that:

DA0=A[i]·A[i+1]
DA1=A[i]·A[i+1]'
DA2=A[i]'·A[i+1]
DA3=A[i]'·A[i+1]'
DB0=B[i]·B[i+1]
DB1=B[i]·B[i+1]'
DB2=B[i]'·B[i+1]
DB3=B[i]'·B[i+1]'

Figure 7:
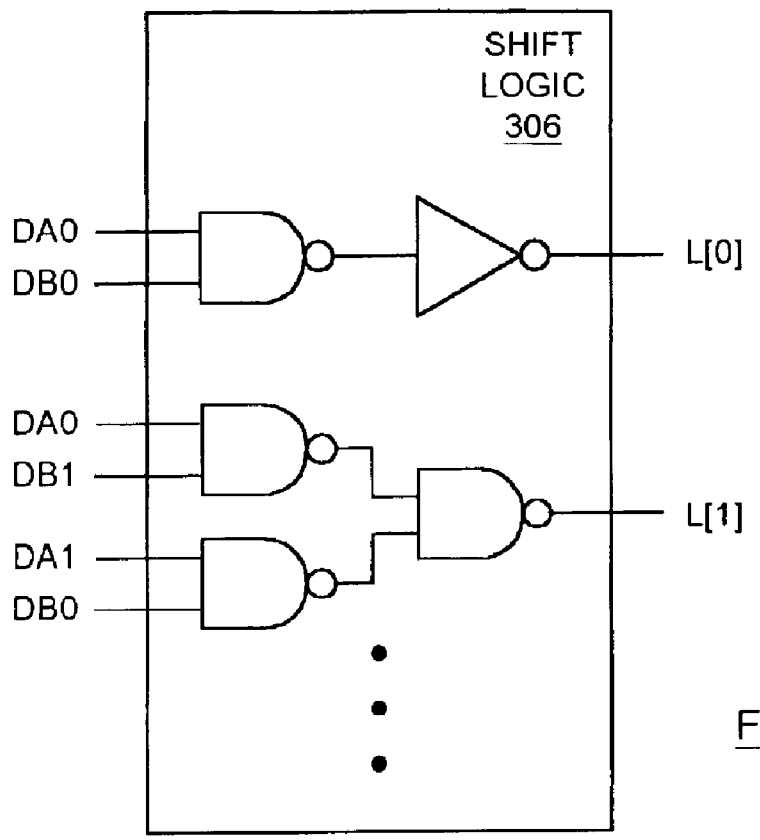
FIG. 7 is a diagram of one embodiment of the first shift logic unit of FIG. 3.

FIG. 7 is a diagram of one embodiment of the shift logic 306 of FIG. 3. In the embodiment of FIG. 7, the shift logic 306 receives the DA0, DA1, DA2, DA3, DB0, DB1, DB2, and DB3 signals produced by the 2-bit-pair predecoder 304 of FIGS. 3 and 6, and uses the DA0, DA1, DA2, DA3, DB0, DB1, DB2, and DB3 signals to sum the A[i+1], A[i], B[i+1], and B[i] signals via shifting, thereby producing the 7-bit L term "L[6:0]" such that:

L[0]=DA0·DB0
L[1]=DA0·DB1+DA1·DB0
L[2]=DA0·DB2+DA2·DB0+DA1·DB1
L[3]=DA0·DB3+DA3·DB0+DA1·DB2+DA2·DB1
L[4]=DA2·DB2+DA3·DB1+DA1·DB3
L[5]=DA2·DB3+DA3·DB2
L[6]=DA3·DB3

Figure 8:
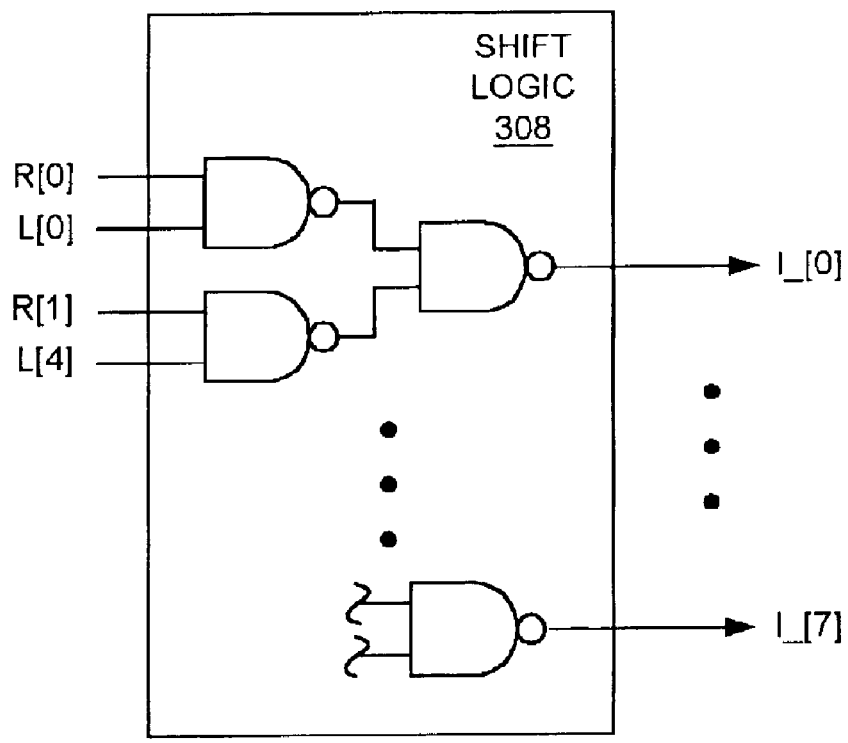
FIG. 8 is a diagram of one embodiment of the second shift logic unit of FIG. 3.

FIG. 8 is a diagram of one embodiment of the shift logic 308 of FIG. 3. In the embodiment of FIG. 8, the shift logic 308 receives the 2-bit R term R[1:0] produced by the rotate logic 302 of FIGS. 3 and 5 and the 7-bit L term L[6:0] produced by the shift logic 306 of FIGS. 3 and 7, and sums the R term R[1:0] and the L term L[6:0] to form the 8-bit output signal I_[7:0] of the 3-bit sum predecoder 202 of FIG. 2 by shifting the L term L[6:0] by the value of the R term R[1:0] such that:

I_[0]=R[0]·L[0]+R[1]·L[4]
I_[1]=R[0]·L[1]+R[1]·L[5]
I_[2]=R[0]·L[2]+R[1]·L[6]
I_[3]=R[0]·L[3]
I_[4]=R[0]·L[4]+R[1]·L[0]
I_[5]=R[0]·L[5]+R[1]·L[1]
I_[6]=R[0]·L[6]+R[1]·L[2]
I_[7]=R[1]·L[3]

Figure 9A:
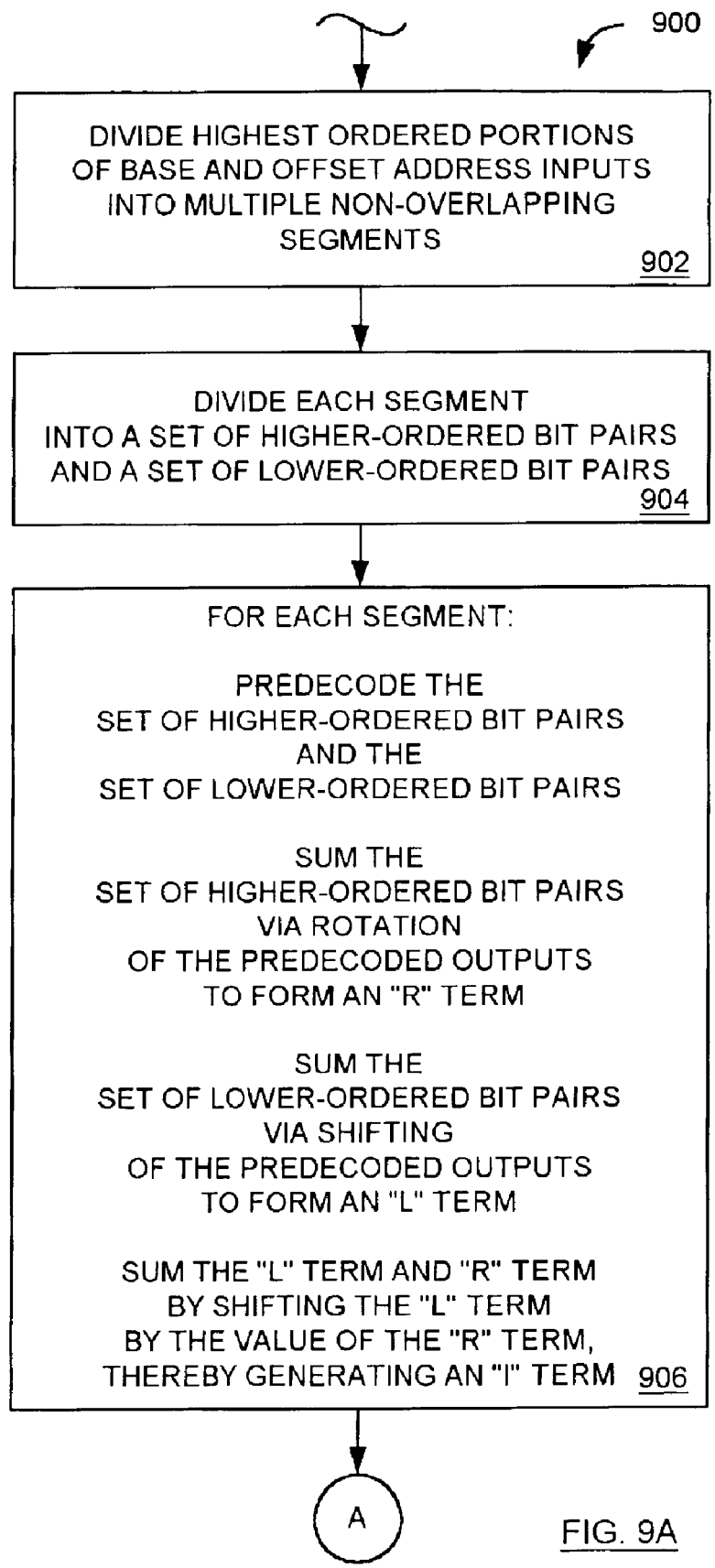
FIGS. 9A and 9B in combination form a flow chart of a method for producing a set of signals for use in accessing a data array of a memory.
Figure 9B:
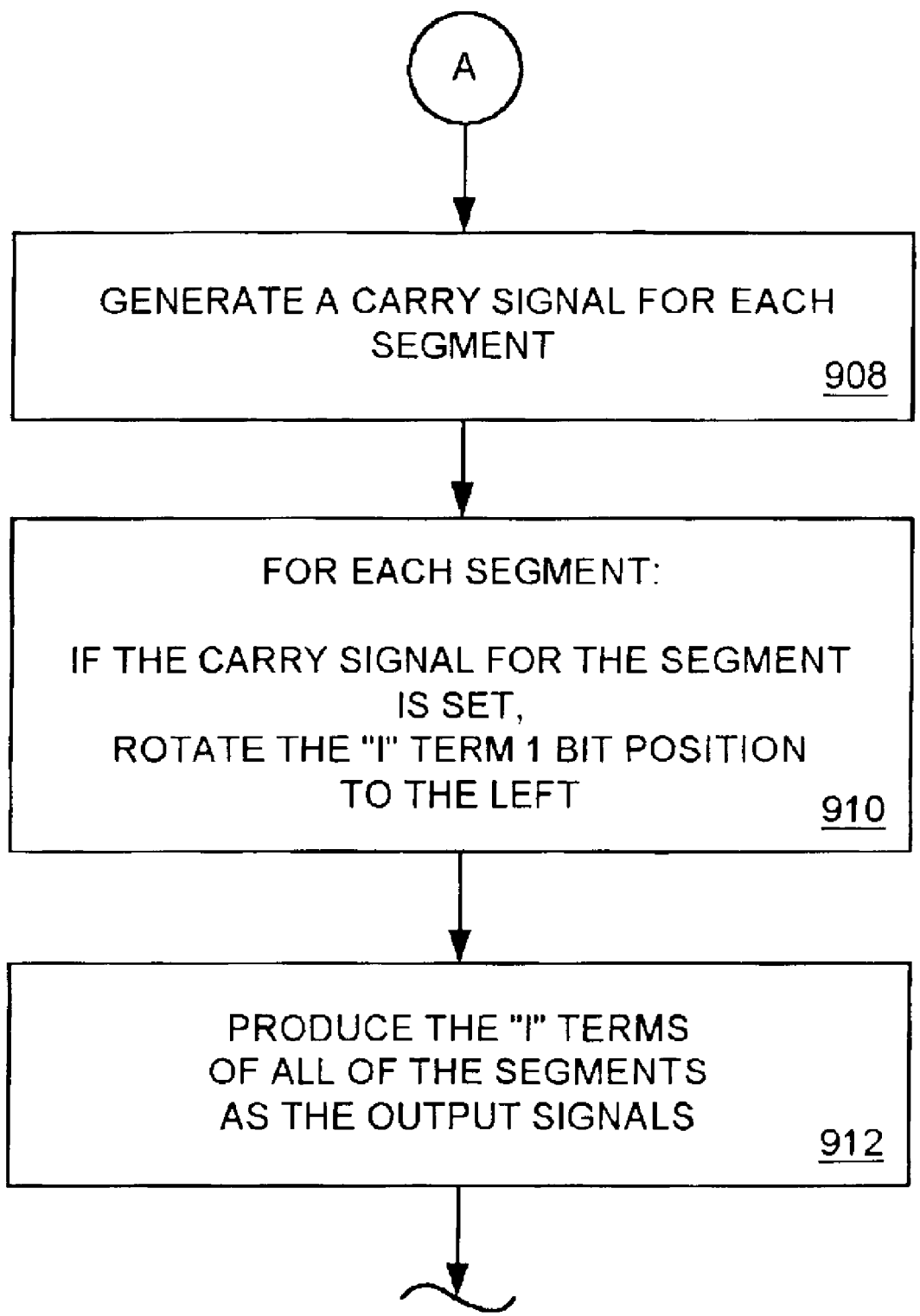

FIGS. 9A and 9B in combination form a flow chart of a method 900 for producing a set of signals for use in accessing a data array of a memory. During an operation 902 of the method 900, highest ordered portions of a base address input and an offset address input are divided into multiple non-overlapping segments (e.g., non-overlapping 3-bit segments as in the sum decoder 200 of FIG. 2). As a result, a number of least significant bits remain. Each of the segments is then divided into a set of higher-ordered bit pairs (e.g., including one bit pair as in FIG. 3) and a set of lower-ordered bit pairs (e.g., including two bit pairs as in FIG. 3) during an operation 904.

During an operation 906, the following operations are performed for each segment. The set of higher-ordered bit pairs and the set of lower-ordered bit pairs are predecoded. The set of higher-ordered bit pairs are summed via rotation of the predecoded outputs of the set of higher-ordered bit pairs to form an R term (e.g., R[1:0] described above). The set of lower-ordered bit pairs are summed via shifting of the predecoded outputs of the set of lower-ordered bit pairs to form an L term (e.g., L[6:0] described above). The R term and the L term are summed by shifting the L term by the value of the R term, thereby generating an I term (e.g., signal I_[7:0] described above).

During an operation 908, a carry signal is generated for each of the segments. The following operation is performed for each segment during an operation 910: if the carry signal for the segment is set (i.e., active or asserted), the corresponding I term is rotated 1 bit position to the left (i.e., in a higher-ordered direction). During an operation 912, the I terms of all the segments are produced as the set of signals.

Figure 10:
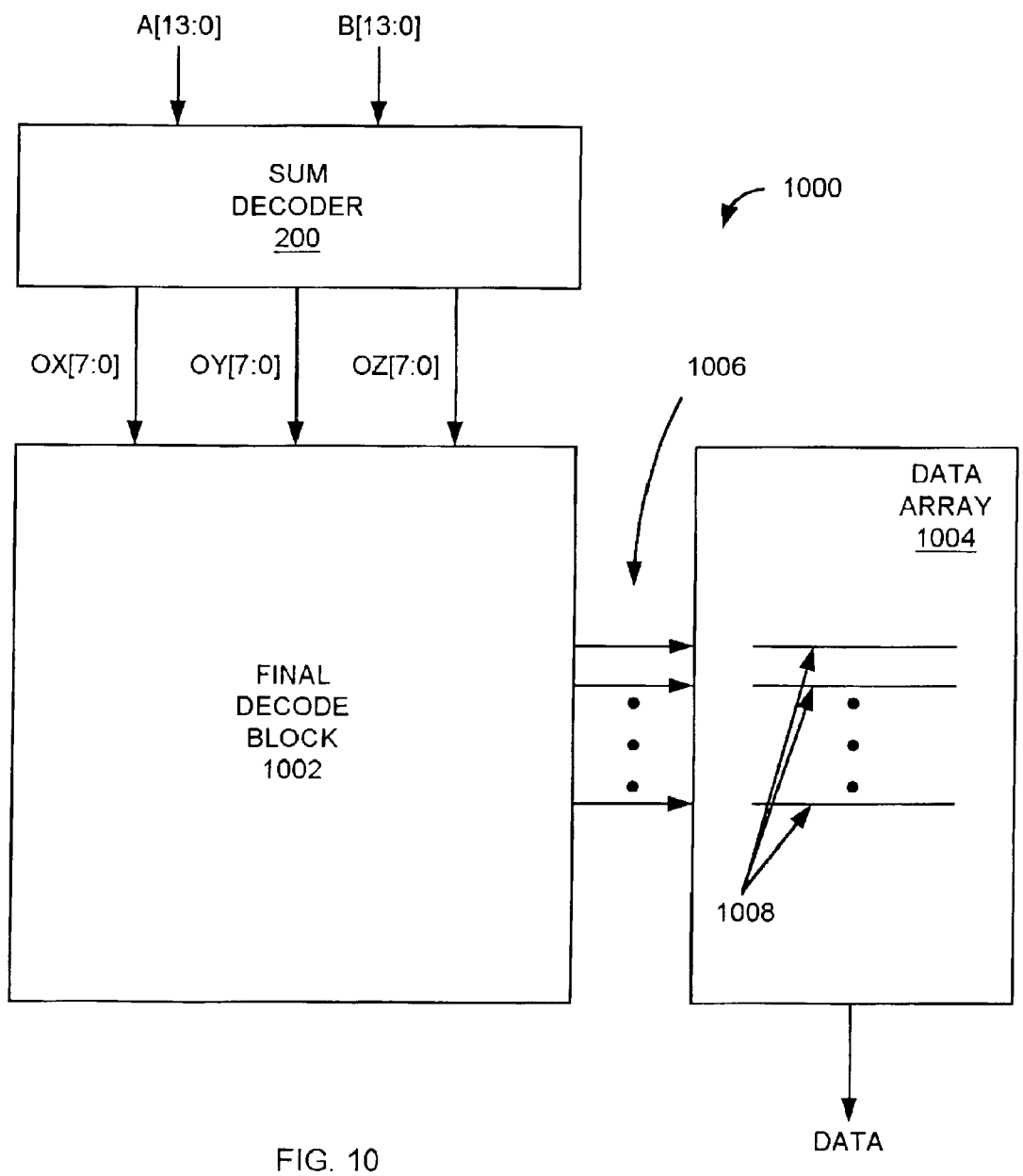
FIG. 10 is a diagram of a memory including the sum decoder of FIG. 2, a final decode block, and a data array.

FIG. 10 is a diagram of a memory 1000 including the sum decoder 200 of FIG. 2, a final decode block 1002, and a data array 1004. Data stored within the memory 1000 is accessed dependent upon an arithmetic sum of the base address signal A[13:0] and the offset address signal B[13:0] received by the sum decoder 200, thus the memory 1000 may be referred to as a sum-addressed memory (SAM). The final decode block receives the OX[7:0], OY[7:0], and OZ[7:0] signals produced by the sum decoder 200, and performs logical operations (e.g., AND operations) on the OX[7:0], OY[7:0], and OZ[7:0] signals to produce (8)(8)(8)=512 selection signals 1006. The data array 1004 is configured to store data, and includes 512 word lines 1008. Each of the 512 word lines 1008 is and is activated by a different one of the 512 selection signals 1006 and used to access a different "word" quantity of the data stored in the data array 1004.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A sum decoder, comprising:
   a plurality of sum predecoders each coupled to receive a plurality of bit pairs of non-overlapping segments of a first address signal and a second address signal, and configured to produce an input signal dependent upon the bit pairs;
   a carry generator coupled to receive a lower-ordered portion of the first and second address signals and configured to generate a plurality of carry signals each corresponding to a different one of the sum predecoders; and
   a plurality of rotate logic units each coupled to receive the input signal produced by a corresponding one of the sum predecoders, and a corresponding one of the carry signals, and configured to rotate the bits of the input signal dependent upon the carry signal, and to produce either the input signal or the rotated input signal as an output signal.

2. The sum decoder as recited in claim 1, wherein the first address signal represents a base address and the second address signal represents an offset address.

3. The sum decoder as recited in claim 1, wherein the first address signal and the second address signal each comprise a plurality of bits in ordered bit positions, and wherein a highest ordered portion of the first address signal and a corresponding highest ordered portion of the second address signal are divided into a plurality of non-overlapping segments.

4. The sum decoder as recited in claim 1, wherein each bit pair comprises a bit of the first address signal and a corresponding bit of the second address signal.

5. The sum decoder as recited in claim 1, wherein each of the sum predecoders comprises:
   a first bit pair predecoder coupled to receive a highest ordered one of the bit pairs received by the sum predecoder and configured to decode the highest ordered bit pair thereby producing a first intermediate signal; and
   a second bit pair predecoder coupled to receive the remaining bit pairs received by the sum predecoder and configured to decode the remaining bit pairs thereby producing a second intermediate signal.

6. The sum decoder as recited in claim 5, wherein each of the sum predecoders further comprises:
   a rotate logic unit coupled to receive the first intermediate signal and to sum the highest ordered bit pair via rotation, thereby producing an R term;
   a first shift logic unit coupled to receive the second intermediate signal and configured to sum the remaining bit pairs via shifting, thereby producing an L term; and
   a second shift logic unit coupled to receive the R term and the L term and configured to sum the R term and the L term via shifting, thereby producing the input signal produced by the sum predecoder.

7. The sum decoder as recited in claim 1, wherein in the event the received carry signal is set, each of the rotate logic units is configured to rotate the bits of the input signal by one bit position and to produce the rotated input signal as the output signal.

8. The sum decoder as recited in claim 1, wherein in the event the received carry signal is not set, each of the rotate logic units is configured to produce the input signal as the output signal.

9. A memory, comprising:
   a sum decoder, comprising:
      a plurality of sum predecoders each coupled to receive a plurality of bit pairs of non-overlapping segments of a first address signal and a second address signal, and configured to produce an input signal dependent upon the bit pairs;
      a carry generator coupled to receive a lower-ordered portion of the first and second address signals and configured to generate a plurality of carry signals each corresponding to a different one of the sum predecoders; and
      a plurality of rotate logic units each coupled to receive the input signal produced by a corresponding one of the sum predecoders, and a corresponding one of the carry signals, and configured to rotate the bits of the input signal dependent upon the carry signal, and to produce either the input signal or the
   rotated input signal as an output signal comprising a plurality of bits;
   a final decode block coupled to the receive the output signals produced by the rotate logic units of the sum decoder and configured to perform logical operations on the output signals to produce a plurality of selection signals; and
   a data array configured to store data and comprising a plurality of word lines, wherein each of the word lines is activated by a different one of the selection signals.

10. The memory as recited in claim 9, wherein the first address signal represents a base address and the second address signal represents an offset address.

11. The memory as recited in claim 9, wherein the first address signal and the second address signal each comprise a plurality of bits in ordered bit positions, and wherein a highest ordered portion of the first address signal and a corresponding highest ordered portion of the second address signal are divided into a plurality of non-overlapping segments.

12. The memory as recited in claim 9, wherein each bit pair comprises a bit of the first address signal and a corresponding bit of the second address signal.

13. The memory as recited in claim 9, wherein in the event the received carry signal is set, each of the rotate logic units is configured to rotate the bits of the input signal by one bit position and to produce the rotated input signal as the output signal.

14. The sum decoder as recited in claim 9, wherein in the event the received carry signal is not set, each of the rotate logic units is configured to produce the input signal as the output signal.

15. A method for producing a plurality of signals for accessing a memory, comprising:
    receiving a first address signal and a second address signal each comprising a plurality of bits in ordered bit positions, wherein each bit of the first address signal corresponds to a different bit of the second address signal;
    dividing a highest ordered portion of the first address signal and a corresponding highest ordered portion of the second address signal into a plurality of non-overlapping segments;
    generating a corresponding I term for each of the segments;
    generating a corresponding carry signal for each of the segments;
    for each of the segments, in the event the corresponding carry signal is set, rotating the corresponding I term one bit position; and
    producing the I terms as the plurality of signals.

16. The method as recited in claim 15, wherein the first address signal represents a base address and the second address signal represents an offset address.

17. The method as recited in claim 15, wherein following the dividing the highest ordered portion of the first address signal and the corresponding highest ordered portion of the second address signal, a number of least significant bits remain.

18. The method as recited in claim 15, wherein the generating the corresponding I term for each of the segments comprises:
    performing the following for each of the segments:
        dividing corresponding bits of the first and second address signals into a set of higher-ordered bit pairs and a set of lower-ordered bit pairs;
        predecoding the set of higher-ordered bit pairs and the set of lower-ordered bit pairs;
        summing the set of higher-ordered bit pairs to form an R term;
        summing the set of lower-ordered bit pairs to form an L term; and
        summing the R term and the L term to form a corresponding I term.

19. The method as recited in claim 18, wherein the summing the set of higher-ordered bit pairs is accomplished via rotation of the predecoded outputs of the set of higher-ordered bit pairs.

20. The method as recited in claim 18, wherein the summing the set of lower-ordered bit pairs to form the L term is accomplished via shifting of the predecoded outputs of the set of lower-ordered bit pairs.

21. The method as recited in claim 18, wherein the summing the R term and the L term to form the corresponding I term is accomplished by shifting the L term by a value of the R term.

* * * * *